US006941532B2

(12) United States Patent
Haritsa et al.

(10) Patent No.: US 6,941,532 B2
(45) Date of Patent: Sep. 6, 2005

(54) CLOCK SKEW VERIFICATION METHODOLOGY FOR GRID-BASED DESIGN

(75) Inventors: Manjunath D. Haritsa, Sunnyvale, CA (US); Manishkumar B. Ankola, Santa Clara, CA (US); Ralf Schmitt, Sunnyvale, CA (US); Anup Sharma, Santa Clara, CA (US); Stephan Hoerold, Sunnyvale, CA (US); David Minoru Murata, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/982,452

(22) Filed: Oct. 17, 2001

(65) Prior Publication Data

US 2003/0074642 A1 Apr. 17, 2003

(51) Int. Cl.[7] .............................................. G06F 17/50
(52) U.S. Cl. ................................ 716/6; 716/12; 716/13
(58) Field of Search ............................ 716/4–8, 12–18, 716/19, 20, 21, 22; 703/15, 16, 23, 24; 713/20, 21

(56) References Cited

U.S. PATENT DOCUMENTS

| | | | |
|---|---|---|---|
| 5,239,215 A | 8/1993 | Yamaguchi | 307/480 |
| 5,387,855 A | 2/1995 | Miyazaki et al. | |
| 5,467,040 A | 11/1995 | Nelson | |
| 5,581,473 A | 12/1996 | Rusu et al. | |
| 5,644,498 A | 7/1997 | Joly et al. | |
| 5,656,963 A | 8/1997 | Masleid et al. | |
| 5,778,216 A | 7/1998 | Venkatesh | |
| 5,864,487 A * | 1/1999 | Merryman et al. | 716/6 |
| 5,896,055 A | 4/1999 | Toyonaga et al. | |
| 5,911,063 A | 6/1999 | Allen et al. | 395/555 |
| 5,917,729 A * | 6/1999 | Naganuma et al. | 716/10 |

(Continued)

FOREIGN PATENT DOCUMENTS

WO     WO 95/34036     12/1995

OTHER PUBLICATIONS

R.B. Mueller et al., "*Parallel Switch–Level Simulation for VLSI*", IEEE, 1991, pp. 324–328.
Scot Boon et al., "High Performance Clock Distribution for CMOS Asics", IEEE 1989, pp. 15.4.1–15.4.5.
H. Fair et al., "*XP–000862228 SP 25.2: Clocking Design and Analysis for a 600MHz Alpha Microprocessor*", IEEE International Solid–State Circuits Conference, 1998, pp. 389–399 & 473.

(Continued)

*Primary Examiner*—Vuthe Siek
*Assistant Examiner*—Binh Tat
(74) *Attorney, Agent, or Firm*—Gunnison, McKay & Hodgson, L.L.P.

(57) ABSTRACT

A method and apparatus for determining clock insertion delays for a microprocessor design having a grid-based clock distribution. The method includes partitioning the complete clock net into a global clock net and a plurality of local clock nets, simulating a load for each of the local clock nets, simulating the global clock net, and combining the simulations to form the complete clock net. The method may further include evaluating the combination to determine whether the results converge and storing the simulation results in a Clock Data Model. When the results do not converge, the method re-simulates at least one of the local clock nets and re-simulates the global clock net. The Clock Data Model collects, manages, retrieves, and queries all of the simulation information. The method may further analyze the complete clock net to predict the clock skew for a given data transfer path for potential redesign.

77 Claims, 8 Drawing Sheets

U.S. PATENT DOCUMENTS

| | | | | |
|---|---|---|---|---|
| 5,923,188 | A | | 7/1999 | Kametani et al. ............. 326/93 |
| 5,963,729 | A | | 10/1999 | Aji et al. |
| 5,974,245 | A | | 10/1999 | Li et al. |
| 5,994,924 | A | | 11/1999 | Lee et al. |
| 6,025,740 | A | | 2/2000 | Fukuyama ................... 326/93 |
| 6,053,950 | A | * | 4/2000 | Shinagawa ..................... 716/2 |
| 6,088,254 | A | | 7/2000 | Kermani |
| 6,150,865 | A | * | 11/2000 | Fluxman et al. ............ 327/292 |
| 6,204,713 | B1 | * | 3/2001 | Adams et al. .............. 327/295 |
| 6,205,571 | B1 | * | 3/2001 | Camporese et al. ........... 716/2 |
| 6,205,572 | B1 | * | 3/2001 | Dupenloup .................... 716/5 |
| 6,260,182 | B1 | * | 7/2001 | Mohan et al. ............... 716/12 |
| 6,263,478 | B1 | | 7/2001 | Hahn et al. |
| 6,289,412 | B1 | | 9/2001 | Yuan et al. |
| 6,289,498 | B1 | | 9/2001 | Dupenloup |
| 6,305,001 | B1 | * | 10/2001 | Graef .......................... 716/12 |
| 6,311,313 | B1 | * | 10/2001 | Camporese et al. ........... 716/6 |
| 6,378,080 | B1 | | 4/2002 | Anjo et al. |
| 6,442,740 | B1 | * | 8/2002 | Kanamoto et al. ............. 716/6 |

OTHER PUBLICATIONS

International Search Report, PCT/US 02/32937, International filing date Oct. 15, 2002, date Search Report mailed Jan. 28, 2004.

B. Lamson et al., A Processor for a High–Performance Personal Computer, Seventh Annual Symposium on Computer Architecture, pp. 146–160, May 1980.

C–S Wu et al., "An Automatic Cell Characterization Environment for Cell–Based Design Methodology", IEEE pp. 326–329, May 1993.

J. Burkis, "Clock Tree Synthesis for High Performance ASICs", IEEE, pp. 9–8.3, Aug. 1991.

U–S Yim et al., A Floorplan–based Planning Methodology for Power and Clock Distribution in ASICs:, Proceedings ACM/IEEE Conference on Design Automation, pp. 766–771, Jun. 1999.

P.J. Restle et al., "A Clock Distribution Network for Microprocessors", 2000 Symposium on VLSI Circuits, pp. 184–187, Apr. 2000.

* cited by examiner

CLOCK SKEW VERIFICATION METHODOLOGY FOR GRID-BASED DESIGN

CROSS-REFERENCE TO RELATED APPLICATIONS

This application is related to U.S. patent application Ser. No. 09/982,459, entitled "Unified Database System to Store, Combine, and Manipulate Clock Related Data for Grid-Based Clock Distribution Design," in the name of Ralf M. Schmitt and Manjunath D. Haritsa, now published as 2003/0074643 A1, and U.S. patent application Ser. No. 09/982,458, entitled "Simulation by Parts method for Grid-Based Clock Distribution Design," in the name of Manjunath D. Haritsa and Ralf M. Schmitt, now published as 2003/0074175A1, both filed on an even date herewith and commonly assigned wherewith.

FIELD OF THE INVENTION

The present invention relates generally to a method for determining clock circuitry parameters in an integrated circuit design. More specifically, the present invention relates to employing clock net data to determine clock insertion delays for a microprocessor design having grid-based clock distribution.

BACKGROUND OF THE INVENTION

Clock skew adjustment and verification is an important part of digital circuit and more specifically microprocessor design. A clock signal provides the timing reference for all data exchanges inside an integrated circuit (IC) or "chip." This clock signal is provided from a single clock signal generator, which can be either off-chip or on-chip, and is distributed over the entire chip to every circuit element that requires a timing reference, for example, a flip-flop among others. The time required for the clock signal to propagate to a particular clocked element is known as a clock insertion delay corresponding to that clocked element. The difference between the insertion delays of two elements capable of exchanging data is known as the clock skew for these two elements. Depending on the circumstances and relative to the two elements exchanging data, clock skew may either make the clock signal too early or too late. Clock skew is classified as being one of two types known as maxtime and mintime skew. Excessive clock skew can decrease the performance and increase the size and power consumption of an IC.

Figure 1:
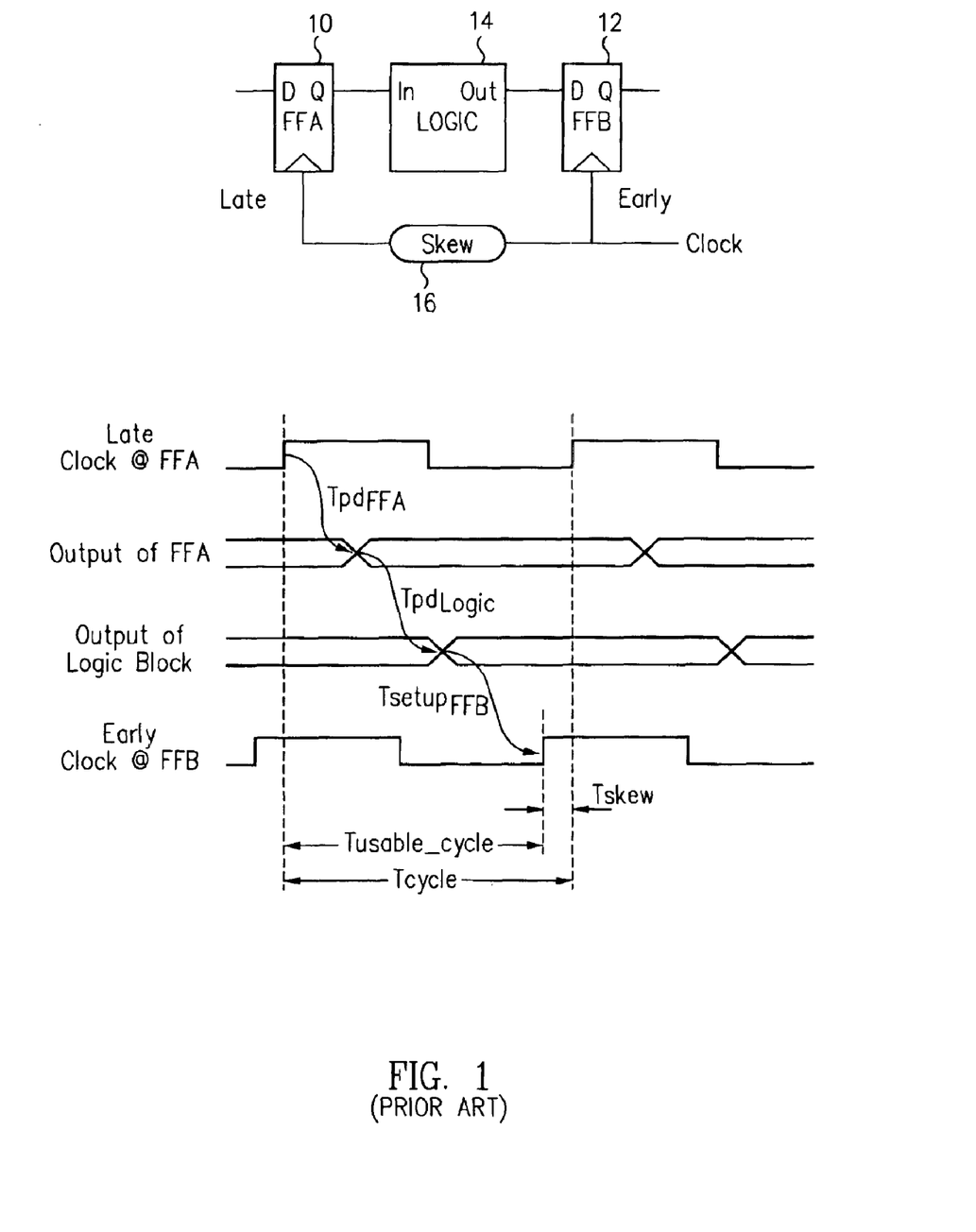
FIG. 1 is a block diagram and a timing diagram exemplifying maxtime type clock skew.

Turning first to FIG. 1, a block diagram and a timing diagram exemplifying maxtime type clock skew is shown. The block diagram shows a first flip-flop (FFA) 10, a second flip-flop (FFB) 12, and a logic device 14 connected as shown. The Clock signal line is shown to have a skew 16 which makes the signal to the FFB 12 early and the signal to the FFA 10 late, relatively speaking. The timing diagram shows a propagation delay time of the FFA 10, $Tpd_{FFA}$, a logic delay time of the logic device 14, $Tpd_{logic}$, a setup time of the FFB 12, $Tsetup_{FFB}$, and a time of the skew 16, Tskew. A combination of these times determines the usable cycle time, Tusable_cycle, from a cycle time, Tcycle, according to the following equation.

$$Tusable\_cycle = Tcycle - Tskew \geq Tpd_{FFA} + Tdp_{Logic} + Tsetup_{FFB} \quad (1)$$

The value of the maxtime skew Tskew determines the usable cycle time. The greater the clock skew the smaller the usable cycle time. Therefore, it is essential for the performance of the microprocessor to analyze the clock skew for all possible paths in the circuit and to adjust the skew to achieve maximum performance.

Figure 2:
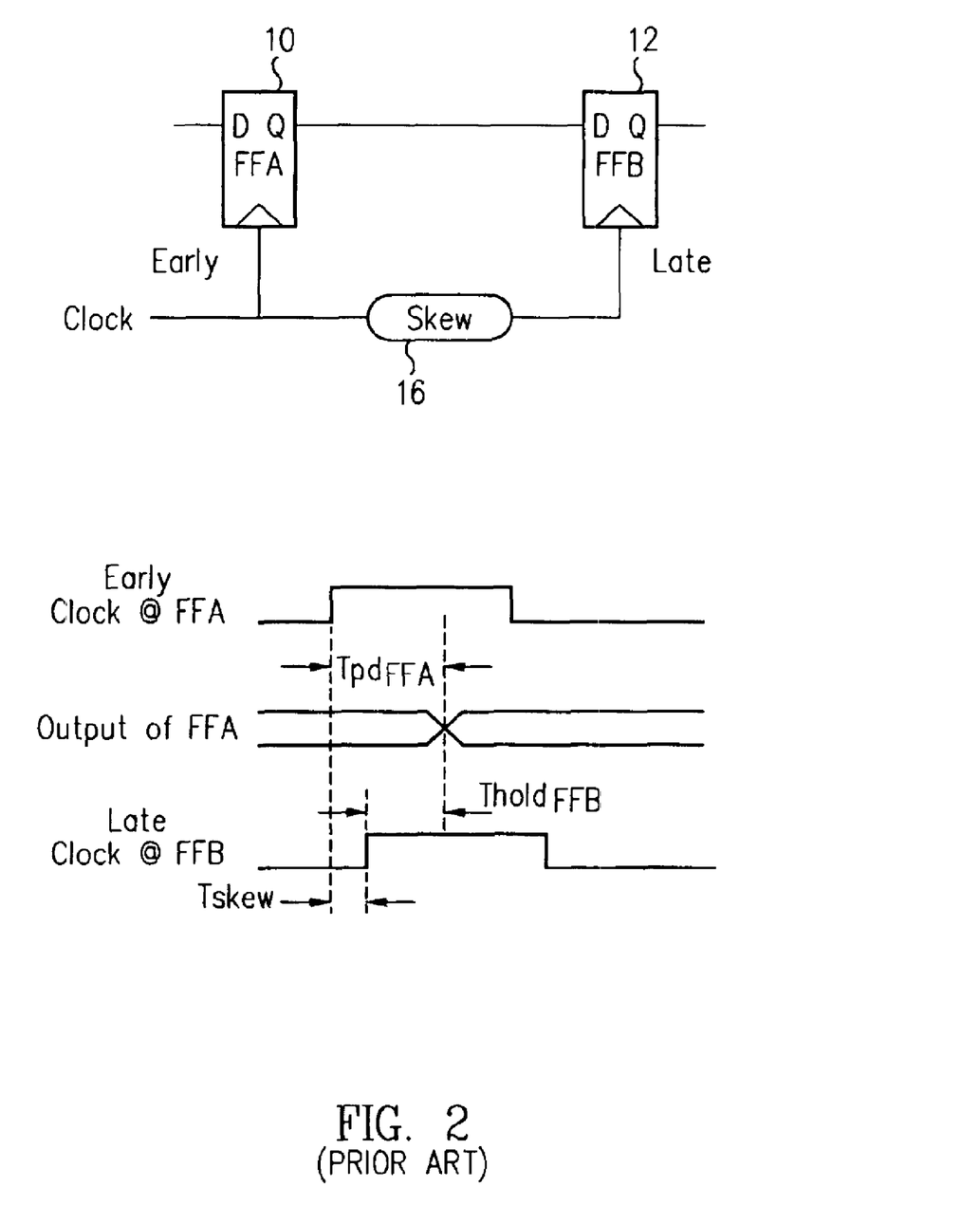
FIG. 2 is a block diagram and a timing diagram exemplifying mintime type clock skew.

Turning now to FIG. 2, a block diagram and a timing diagram exemplifying mintime type clock skew is shown. The block diagram shows FFA 10 connected to FFB 12. This time, the Clock signal skew 16 makes the signal to the FFA 10 early and the signal to the FFB 12 late, relatively speaking. The timing diagram shows a propagation delay time of the FFA 10, $Tpd_{FFA}$, a hold time of the FFB 12, $Thold_{FFB}$, and a time of the skew 16, Tskew.

$$Tpd_{FFA} \geq Thold_{FFB} + Tskew \quad (2)$$

If the natural propagation delay of the FFA 10 is insufficient to achieve the necessary hold time, then additional circuitry must be added between the FFA 10 and the FFB 12 to increase the total propagation delay. This results in more die area and power being consumed. Further, the additional circuitry will have to be added before the circuit is fabricated in order to prevent potential functional failures. This increases production costs and design times.

In both of the clock skew cases described above, an accurate analysis of the clock insertion delay for substantially every single clocked element is valuable to achieving high performance in a microprocessor design. The cost to analyze the insertion delay for a given path increases in general more than linearly with the size of the problem. Analyzing the insertion delay of a large path is generally much more computationally expensive than dividing the large path into several smaller paths and analyzing each of these smaller paths separately. The sum of all of the computational costs for each of the smaller tasks is typically only a fraction of the cost for the entire problem processed as a single task. In addition, several of the smaller paths can potentially be processed in parallel, so that the total runtime cost can be reduced even further. The analysis of all of the insertion delays in a microprocessor design is typically an extremely large computational task, which exceeds any available computational resources as a single analysis task. It can better be solved by dividing this task into a large number of independent smaller tasks.

In conventional microprocessor design, a clock distribution network is tree-based, grid-based, or a hybrid of both. The tree-based clock net has a network of branches from a synthesized clock source to each clocked element. So the one and only one path can be traced directly to the clocked element. Each path can be analyzed separately thus making the calculation of the insertion delay relatively simple and accurate. Of course for a large number of clocked elements, these calculations will still be time consuming but the exceptionally high computational cost of simulating all of the paths simultaneously is avoided.

The grid-based clock net has a wire grid spanning over the entire chip, for example, at distribution level two or L2. At higher distribution levels, that is, for example, levels three through ten or L3–L10, the clock net has a pre-grid distribution net that resembles a tree. At L2, the clock drivers are shorted together by the grid to equalize arrival times. The result is that there is not one and only one path that can be traced directly to the clocked element. Furthermore, the clock arrival time at every clocked element is influenced by the load created by other clocked elements in the neighborhood. Therefore, it is not generally possible to analyze each clocked element separately. Instead the entire grid or at least a large cluster of the grid should be analyzed together to reflect the interaction of the clocked elements on the arrival time of the clock signal on the grid. Since conventionally the computation task cannot be separated easily into sub-tasks as with the tree-based clock net above, analyzing the clock insertion delay in a grid-based design is much more difficult than in a tree-based design and requires potentially a much higher computational cost.

Figure 3:
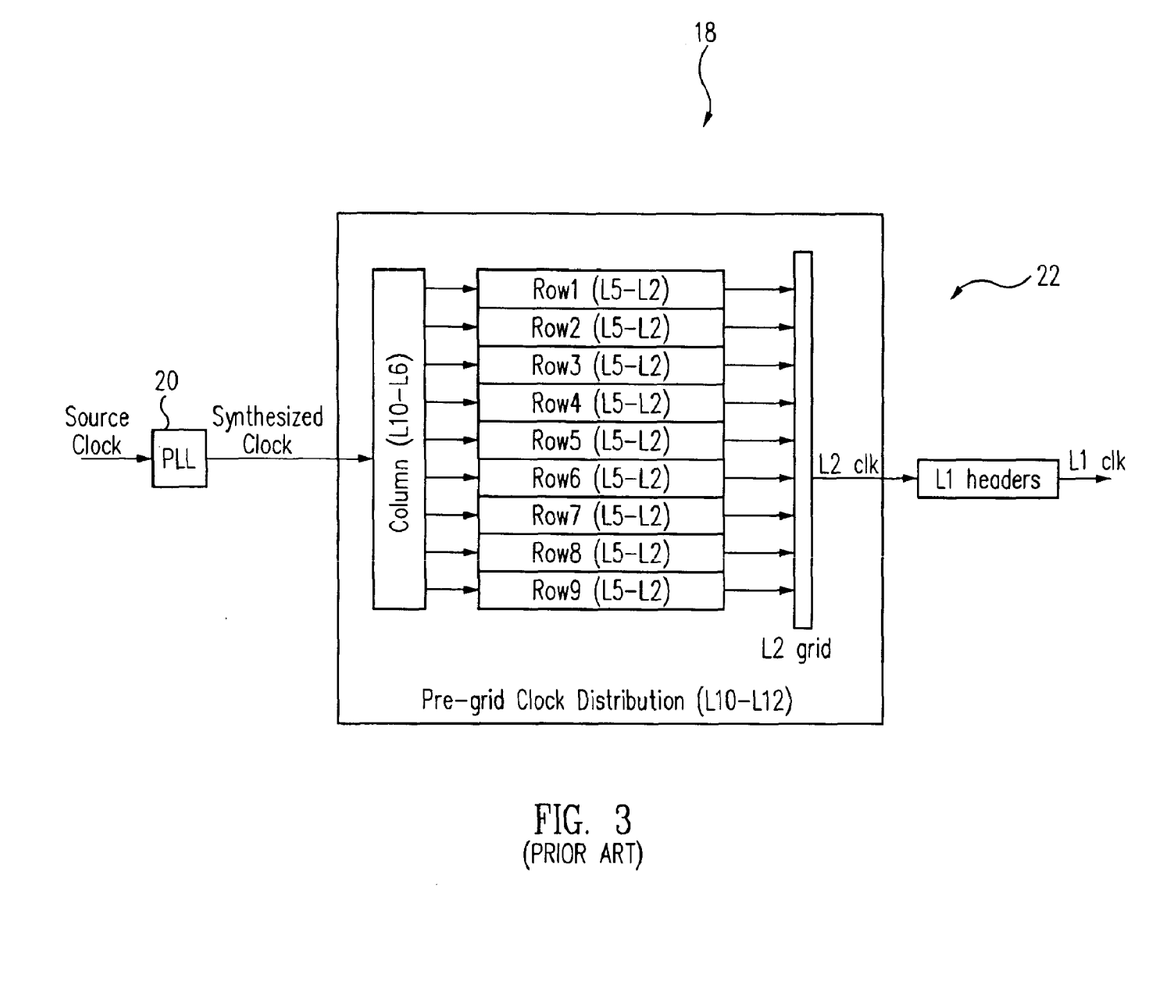
FIG. 3 is a block diagram of a grid-based clock distribution system.

Turning now to FIG. 3, a block diagram of a grid-based clock distribution system 18 is shown. The system 18 includes a phase-locked loop (PLL) 20 and a grid-based clock net 22 having levels ten through one. Levels ten through three form a pre-grid clock net or a global net and levels two and one form a local net. Only nine rows and one level one are shown for simplicity purposes. The exact number will depend on the circumstances. A source clock signal from a source clock (not shown) is fed to the PLL 20 which produces a synthesized clock signal which is fed down through the grid-based clock net 22 from level ten to level one to the clocked elements (not shown).

Figure 4:
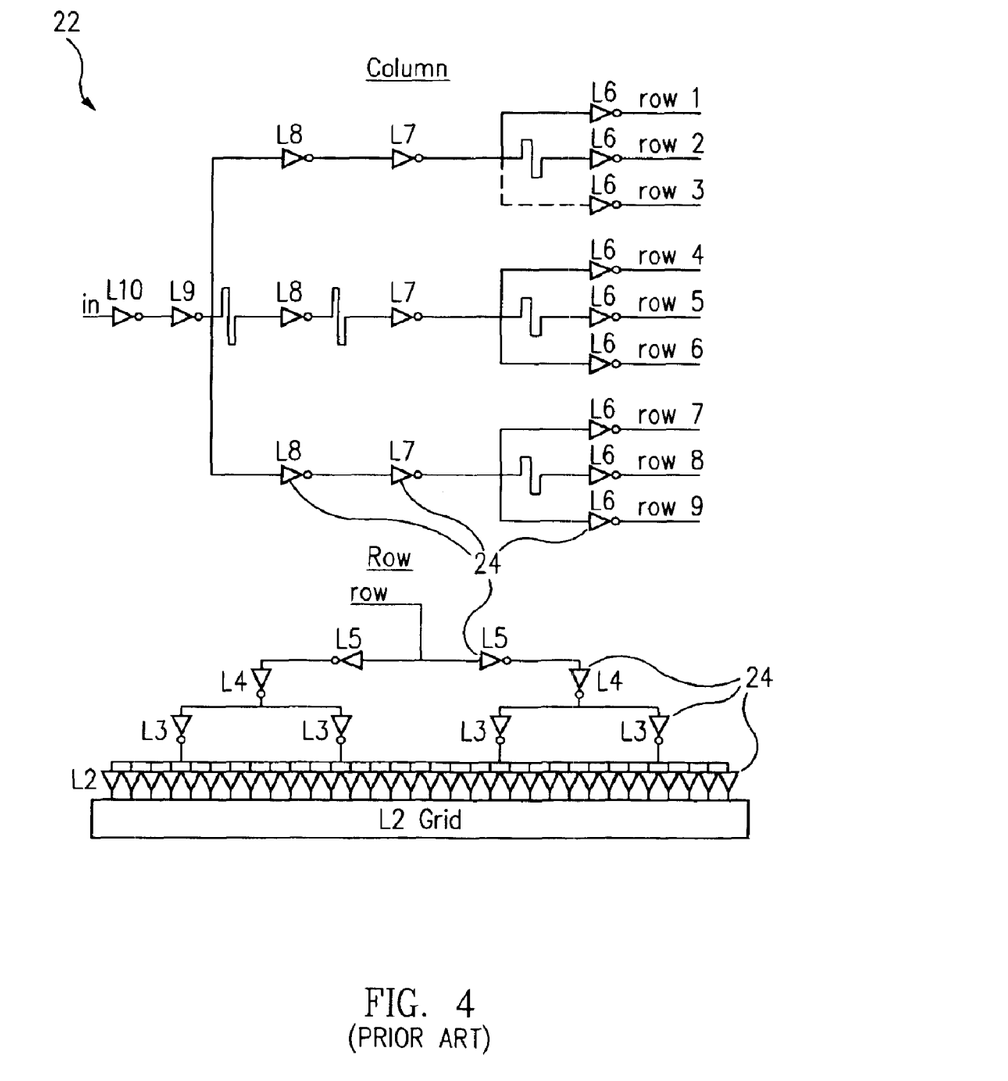
FIG. 4 is a schematic diagram of the grid-based clock net of FIG. 3.

Turning now to FIG. 4, a schematic diagram of the grid-based clock net 22 of FIG. 3 is shown. The column made up of levels ten through six is shown above and one example row of levels five through two is shown below. Each level includes a plurality of buffers 24. The number and layout of the columns, rows, levels, and buffers will depend on the particular application. In this diagram one can see how, to an extent, the pre-grid distribution net resembles a tree.

Figure 5:
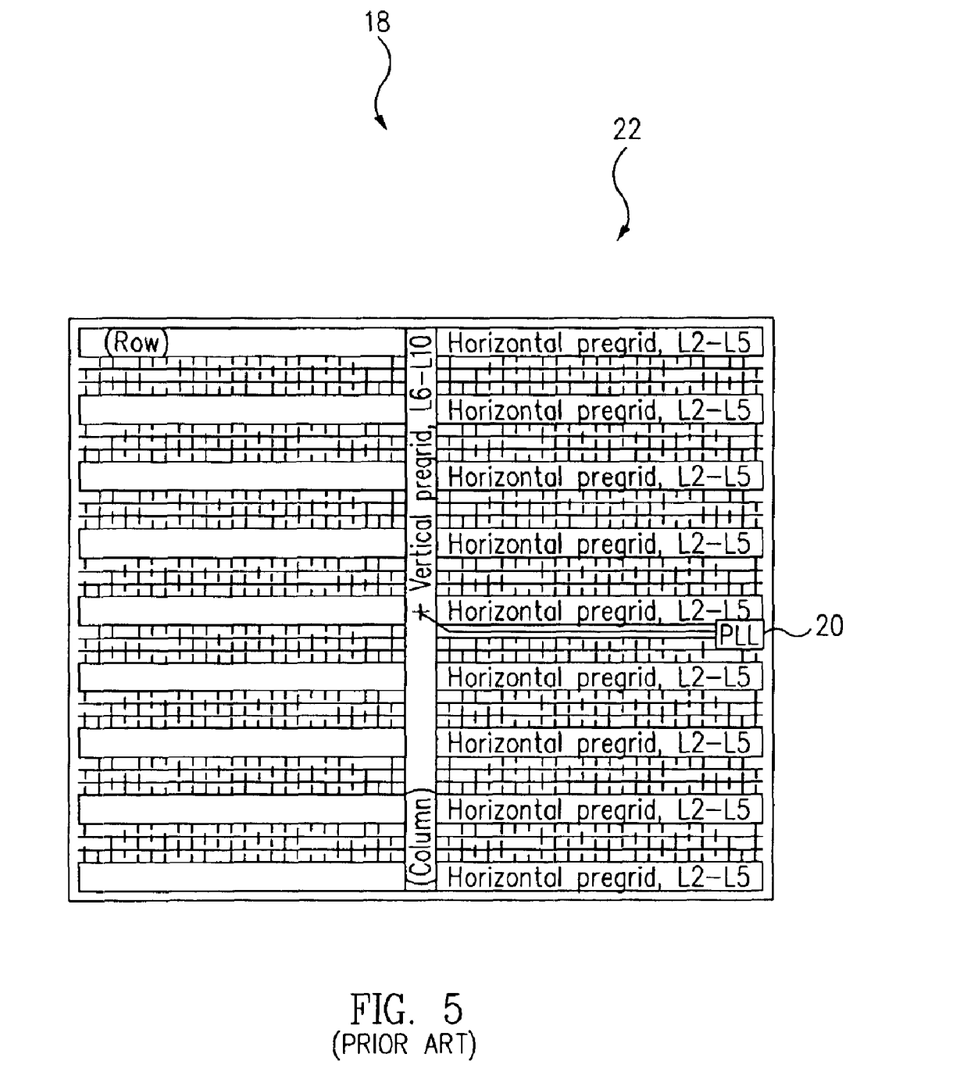
FIG. 5 is a layout diagram of the grid-based clock distribution system of FIG. 3.

Turning now to FIG. 5, a layout diagram of the grid-based clock distribution system 18 of FIG. 3 is shown. The system 18 is shown in a substantially idealized form. This form is rarely if ever achieved in a practical application. The non-ideal form introduces random and systematic skew components. As a result, one must verify the skew based on the actual layout. In this diagram one can see the wire grid spanning over the entire chip.

In both of the clock skew cases described above with respect to FIGS. 1 and 2, it is valuable to analyze the clock insertion delay for each element to predict the clock skew for a given data transfer path and, if necessary, improve performance by adjusting the insertion delays of the involved elements. In addition to the obvious conductor lengths, the clock insertion delay depends in part on parasitic effects such as coupling capacitances to other metal lines in the vicinity of the clock line. Therefore, the clock skew analysis has to be done after the entire microprocessor has been designed and all of the structures are present in a manufacturable form. Because all of the structures in the vicinity of the clock distribution network that might show parasitic interaction with the clock net have to be included, the clock skew analysis is typically very costly in terms of time and computational resources. Furthermore, the clock skew analysis requires circuit simulation tools with a high degree of accuracy. Any uncertainty in the clock insertion delay results caused by the limited accuracy of the simulation tools has to be accounted for as "unknown additional clock skew," thereby limiting the analysis and the resulting system performance. Similarly, the demand for high accuracy increases the cost in terms of time and computational resources. For a standard microprocessor design, that is, one having more than ten million transistors, there comes a point when simulating the complete clock distribution net at one time with high accuracy tools becomes unmanageable with conventional means. The simulation time would be unacceptable and the tools are typically not capable of dealing with such large quantities of data with high accuracy.

BRIEF DESCRIPTION OF THE INVENTION

A method of and an apparatus for determining clock insertion delays for a microprocessor design having a grid-based clock distribution is disclosed. The method includes partitioning the complete clock net into a global clock net and a plurality of local clock nets, simulating a load for each of the local clock nets, simulating the global clock net, and combining the simulations to form the complete clock net. The method may further include evaluating the combination to determine whether the results converge and storing the simulation results in a Clock Data Model. When the results do not converge, the method re-simulates at least one of the local clock nets and re-simulates the global clock net. The Clock Data Model collects, manages, retrieves, and queries all of the simulation information. The method may further analyze the complete clock net to predict the clock skew for a given data transfer path for potential redesign.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a clock skew verification methodology for a grid-based clock distribution design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the specific goals of the developer, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines without departing from the scope and spirit of the inventive concepts disclosed herein.

Figure 6:
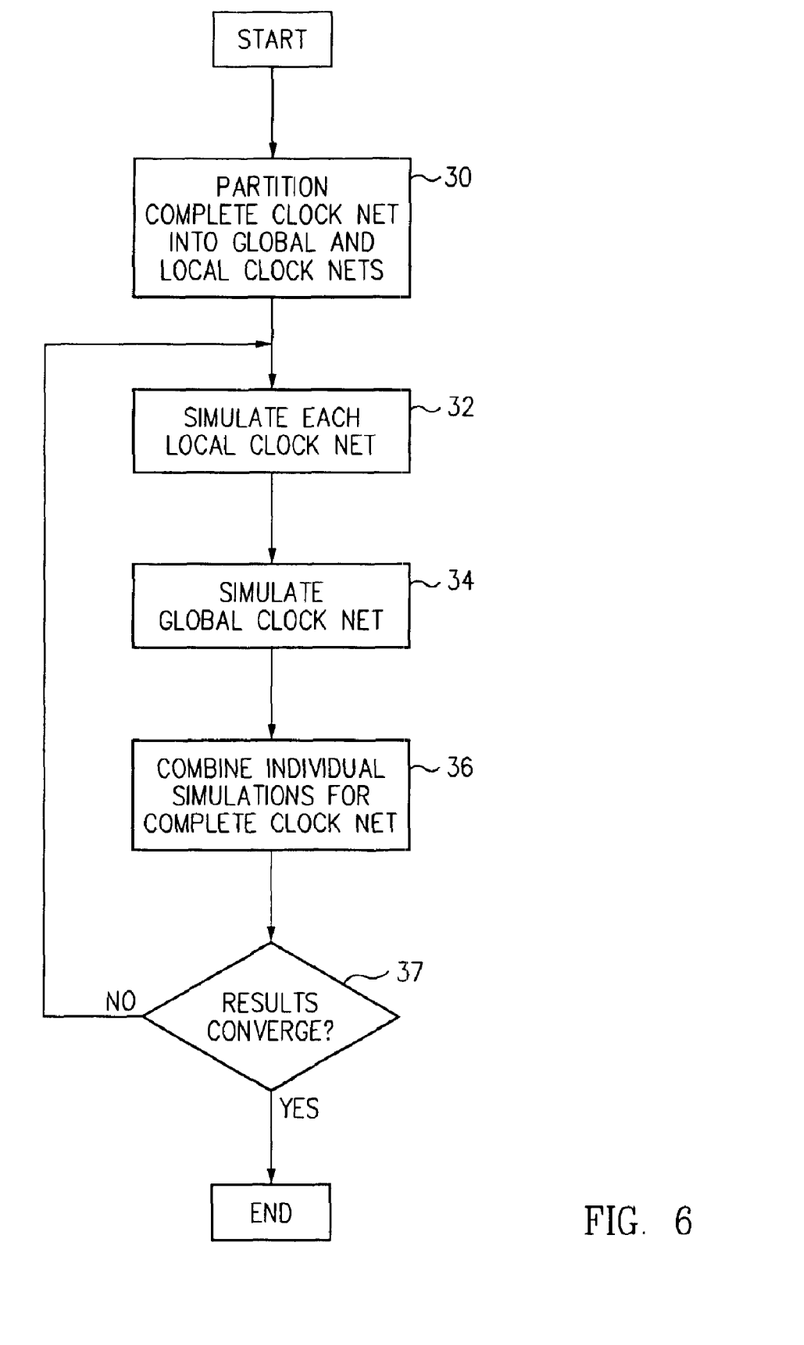
FIG. 6 is a logic flow diagram of a method of determining clock insertion delays for a microprocessor design having grid-based clock distribution.

Turning now to FIG. 6, a logic flow diagram of a method of determining clock insertion delays for a microprocessor design having grid-based clock distribution is shown. The method uses as an input a database containing the entire network information for the microprocessor. This includes the complete clock net information. Typically, the method extracts each piece of information from this database only once but this may not necessarily be the case. The process begins at START. At block 30, the process partitions the complete clock net into a global clock net and a plurality of local clock nets. The global clock net includes levels ten through three and those portions of level two that are outside of all of the plurality of local clock nets. Each of the plurality of local clock nets includes portions of level two and level one. The location of the local clock nets can be determined in any of a number of ways. One valid approach is to break the complete clock net into a plurality of parts approximating rectangular grid coordinates. The designation of the global clock net may be thought of as horizontal partitioning. The designation of local clock nets may be thought of as vertical partitioning. It may be desired or required to break one or more of the local clock nets down even further. This would result in sub-, sub-sub-, etc. local clock nets. At block 32, the process simulates each of the plurality of local clock nets. The process will be described in more detail below. If sub-local clock nets were created in block 30, then the lowest sub-local clock net is simulated first and then each successively higher sub-local clock net is simulated until the highest local clock net has been simulated. In those instances when the simulations of the local clock nets do not depend on one another, they may be processed in parallel. The result is a load for each of the local clock nets on the global clock net. This load may take many forms. One valid form is that of a single capacitor for each of the connections of the local clock net to the global clock net. At block 34, the process simulates the global clock net based in part on the simulated load of each of the plurality of local clock nets. This will also be described in more detail below. At block 36, the process combines the simulations to form the complete clock net. At decision block 37, the complete clock net is evaluated to determine if the results converge. It is possible, if somewhat unlikely, that this block could be eliminated. Often, the results of the first pass will not converge as one would prefer and blocks 32 through 37 will be repeated at least once if not more. More details of this iteration aspect of the method will be described below.

A data model that will be referred to as the Clock Data Model (CDM) collects, manages, retrieves, and queries all of the information created during the different simulations in the process. For each point where a clocked element is connected to the local clock net and where the local clock net is connected to the global clock net, an array of information is stored. First, there is the location of the point. Second, if the point has a simulated load, there is the value of the load. Third, if the point has a clocked element attached to it, there is the name of that element. Fourth, there is the clock arrival time and slope for each point. Depending on the need or desire, other information may also be included.

The CDM provides a quick retrieval mechanism for clock skew and edge rate information. This mechanism can be interfaced with a timing tool to provide accurate clock arrival times for each clocked element in the microprocessor design.

Figure 7:
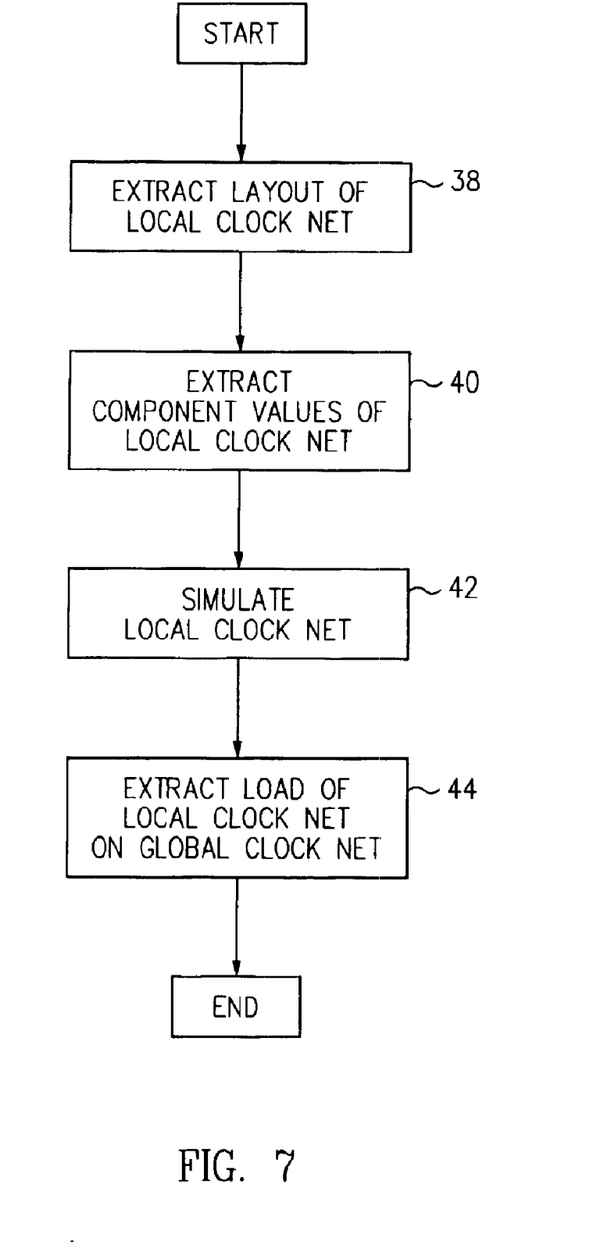
FIG. 7 is a logic flow diagram of the simulation of each of the plurality of local clock nets.

Turning now to FIG. 7, a logic flow diagram of the simulation of each of the plurality of local clock nets is shown. Note that this diagram is related to block 32 of FIG. 6 above. Recall that the various local clock net simulations may be run in parallel. The process begins at START. At block 38, the process extracts the layout of the local clock net from the microprocessor network database. In order to account for all of the coupling capacitances, the conductors routed above and through the local clock net are also extracted. One can visualize this as thought a vertical cross section has been taken of the circuit delineated by the local clock net. This serves to further emphasize the use of the term vertical partitioning. The clock distribution is traced by starting at the point or points where the local clock net is connected to the global clock net. At block 40, the process extracts the component values of the elements of the local clock net from the microprocessor network database. At block 42, the process simulates the local clock net based on the layout and the component values. At least initially, it may be assumed for simulation purposes that the clock arrival times from the global clock net will be simultaneous at all points where the local clock net is connected to the global clock net. This assumption is substantially accurate as this is the goal of the clock net designer. At block 44, the process extracts the load of the local clock net on the global clock net. In addition, the clock arrival time at each of the clocked elements can be measured. All of this information is added to the CDM.

Figure 8:
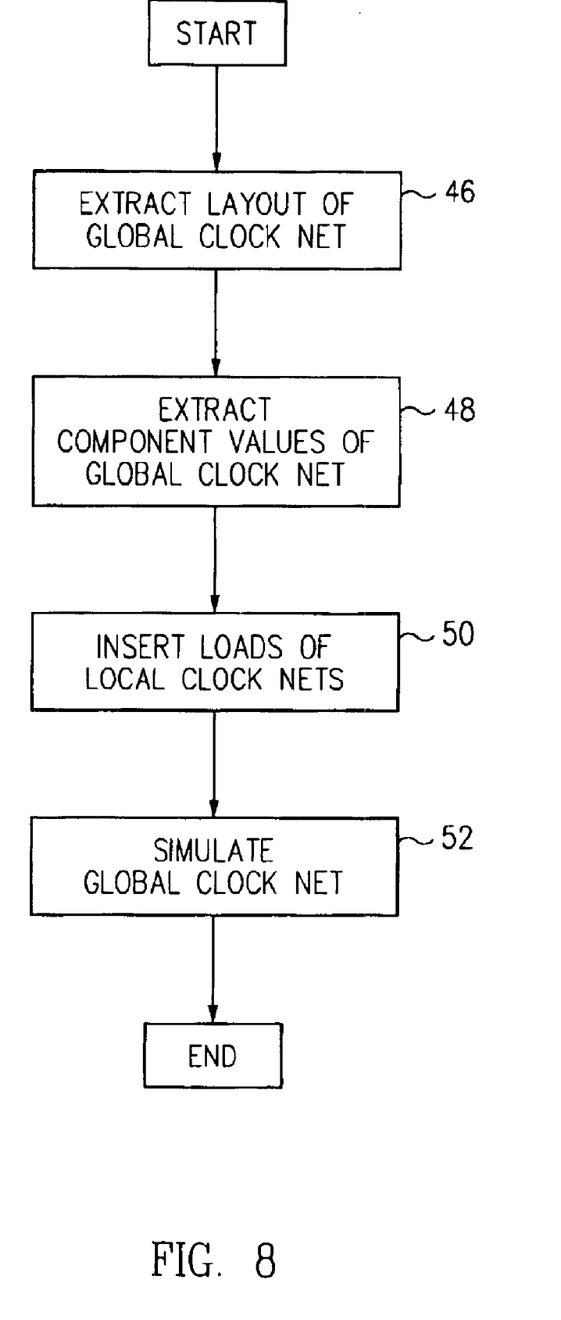
FIG. 8 is a logic flow diagram of the simulation of the global clock net.

Turning now to FIG. 8, a logic flow diagram of the simulation of the global clock net is shown. Note that this diagram is related to block 34 of FIG. 6 above. The process begins at START. At block 46, the process extracts the layout of the global clock net from the microprocessor network database. At block 48, the process extracts the component values of the elements of the global clock net from the microprocessor network database. At block 50, the process inserts the simulated loads of the plurality of local clock nets. At block 52, the process simulates the global clock net based on the layout, the component values, and the simulated local clock net loads. The result is the clock skew distribution on the global clock net. This includes the clock skew times for all points where the local clock net is connected to the global clock net. All of this information is also added to the CDM.

Returning to FIG. 6, taken together, blocks 32–36 and the blocks of FIGS. 7 and 8 result in the initial set up of the CDM. Recall that in FIG. 7 each of the plurality of local clock nets was simulated under the assumption that the clock arrival times from the global clock net would be simultaneous at all points where the local clock net is connected to the global clock net. Recall further that these times were subsequently calculated in block 34 and FIG. 8. As a result, the assumed clock arrival value and the actual clock arrival value can be compared in block 37. If the values have not converged, then blocks 32–37 can be repeated using the calculated times rather than the assumed simultaneous times in block 42 of FIG. 7. Such an iteration will improve the accuracy of the simulations. Although the entirety of blocks 32–37 and the corresponding blocks of FIGS. 7 and 8 may be repeated, this may be undesirable and unnecessary. A more streamlined approach would be to asses each of the plurality of local clock nets in a top down manner to determine whether to re-run the simulation for each particular local clock net. Similar to above, the simulations may be re-run in parallel. All of the local clock nets are reviewed and re-run in block 32 before the global clock net is re-run in block 34. It may not be necessary to re-run the global clock net simulation if the re-calculated loads of the local clock nets attached directly to the global clock net have not changed substantially, that is, they have not changed enough to affect the clock arrival times of the global clock net. As the various simulations are re-run, the CDM is updated. In an effort to further streamline the iteration process, it is possible to skip blocks 38 and 40 of FIG. 7 as this information is already stored in the CDM and has not changed. Also, it is possible to skip blocks 46 and 48 of FIG. 8 for the same reason. Eventually through the iteration process the results will converge and the process will end leaving a substantially fully developed simulation and CDM.

With the complete clock net simulated, it is now possible to analyze the clock insertion delay for each element to predict the clock skew for a given data transfer path and, if necessary, improve performance by adjusting the insertion delays of the involved elements. If there are any performance adjustments or redesigns made, then blocks 32–37 will have to be repeated as with the iteration aspect described above. It is possible to re-run all of the simulations, but this too may be undesirable and unnecessary. A more streamlined approach would be to start by re-running the local clock net or nets involved in the redesign first. Then one can evaluate how far the ripples of the change, if any, may propagate. One may choose to compromise on the redesign to avoid sending any ripples at all. If the redesigned local clock net is connected to one or more sub-local clock nets, then the clock arrival times are evaluated to determine whether the sub-local clock net should be re-run as well. Further, the redesigned local clock net load is evaluated to determine whether the next higher clock net, either local or global, should be re-run as well. The clock arrival times and loads of each re-run clock net attached to the redesigned local clock net are also evaluated for their potential affect on their neighboring clock nets, if any. As the various simulations are re-run, the CDM is updated. Eventually the ripples will cease leaving a substantially fully developed simulation and CDM of the redesign. The redesign process may repeat as desired or required to tailor performance adjustments or to mitigate the affects of performance adjustments.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method of determining clock insertion delays for a microprocessor design having a grid-based clock distribution net, the method comprising:
   partitioning the complete grid-based clock distribution net into a global clock net and a plurality of local clock nets;
   simulating each of the plurality of local clock nets to generate a load for each of the plurality of local clock nets on the global clock net, said simulating including measuring clock arrival time and slope at each point where a clock element is connected;
   simulating the global clock net based in part on the simulated load of each of the plurality of local clock nets; and
   combining the plurality of simulations to form a complete clock net simulation.

2. The method as defined in claim 1, wherein partitioning comprises breaking the complete clock net into a plurality of parts approximating rectangular grid coordinates.

3. The method as defined in claim 1, further comprising breaking at least one of the plurality of local clock nets down into at least one sub-local clock net.

4. The method as defined in claim 3, further comprising simulating the at least one sub-local clock net prior to simulating the corresponding local clock net.

5. The method as defined in claim 1, wherein at least two of the plurality of local clock nets are simulated in parallel.

6. The method as defined in claim 1, wherein simulating each of the plurality of local clock nets comprises:
   extracting a layout of the local clock net and the conductors routed above and through the local clock net from a microprocessor network database;
   extracting component values of the elements of the local clock net from the microprocessor network database;
   simulating the local clock net based on the layout and the component values; and
   extracting a load of the local clock net on the global clock net.

7. The method as defined in claim 6, wherein simulating the local clock net comprises assuming that the clock arrival times from the global clock net will be simultaneous at all points where the local clock net is connected to the global clock net.

8. The method as defined in claim 1, wherein simulating the global clock net comprises:
   extracting the layout of the global clock net from a microprocessor network database;
   extracting component values of the elements of the global clock net from the microprocessor network database;
   inserting the simulated loads of the plurality of local clock nets; and
   simulating the global clock net based on the layout, the component values, and the simulated local clock net loads.

9. The method as defined in claim 1, further comprising storing the plurality of simulation results in a Clock Data Model.

10. The method as defined in claim 1, further comprising evaluating the complete clock net to determine whether the results converge.

11. The method as defined in claim 10, wherein, if the results do not converge, the method further comprises:
    assuming that clock arrival times are those calculated for the simulated global clock net;
    re-simulating at least one of the plurality of local clock nets to generate a load for the at least one local clock net on the global clock net;
    re-simulating the global clock net based in part on the simulated or re-simulated load of each of the plurality of local clock nets; and
    combining the simulations and re-simulations to form the complete clock net.

12. The method as defined in claim 11, wherein re-simulating at least one of the plurality of local clock nets comprises:
    re-simulating the at least one local clock net based on the layout, the component values, and the calculated clock arrival times; and
    extracting a load of the at least one local clock net on the global clock net.

13. The method as defined in claim 12, further comprising re-simulating at least a second of the plurality of local clock nets in parallel with the at least one local clock net.

14. The method as defined in claim 11, wherein re-simulating the global clock net comprises:
   inserting the simulated or re-simulated loads of the plurality of local clock nets; and
   re-simulating the global clock net based on the layout, the component values, and the simulated or re-simulated local clock net loads.

15. The method as defined in claim 11, further comprising storing the plurality of simulation and re-simulation results in a Clock Data Model.

16. An apparatus for determining clock insertion delays for a microprocessor design having a grid-based clock distribution net, the apparatus comprising:
   means for partitioning the complete grid-based clock distribution net into a global clock net and a plurality of local clock nets;
   means for simulating each of the plurality of local clock nets to generate a load for each of the plurality of local clock nets on the global clock net, said means for simulating including means for measuring clock arrival time and slope at each point where a clock element is connected;
   means for simulating the global clock net based in part on the simulated load of each of the plurality of local clock nets; and
   means for combining the plurality of simulations to form a complete clock net simulation.

17. The apparatus as defined in claim 16, wherein means for partitioning comprises means for breaking the complete clock net into a plurality of parts approximating rectangular grid coordinates.

18. The apparatus as defined in claim 16, further comprising means for breaking at least one of the plurality of local clock nets down into at least one sub-local clock net.

19. The apparatus as defined in claim 18, further comprising means for simulating the at least one sub-local clock net prior to simulating the corresponding local clock net.

20. The apparatus as defined in claim 16, wherein at least two of the plurality of local clock nets are simulated in parallel.

21. The apparatus as defined in claim 16, wherein means for simulating each of the plurality of local clock nets comprises:
   means for extracting a layout of the local clock net and the conductors routed above and through the local clock net from a microprocessor network database;
   means for extracting component values of the elements of the local clock net from the microprocessor network database;
   means for simulating the local clock net based on the layout and the component values; and
   means for extracting a load of the local clock net on the global clock net.

22. The apparatus as defined in claim 21, wherein means for simulating the local clock net comprises means for assuming that the clock arrival times from the global clock net will be simultaneous at all points where the local clock net is connected to the global clock net.

23. The apparatus as defined in claim 16, wherein means for simulating the global clock net comprises:
   means for extracting the layout of the global clock net from a microprocessor network database;
   means for extracting component values of the elements of the global clock net from the microprocessor network database;
   means for inserting the simulated loads of the plurality of local clock nets; and
   means for simulating the global clock net based on the layout, the component values, and the simulated local clock net loads.

24. The apparatus as defined in claim 16, further comprising means for storing the plurality of simulation results in a Clock Data Model.

25. The apparatus as defined in claim 16, further comprising means for evaluating the complete clock net to determine whether the results converge.

26. The apparatus as defined in claim 25, wherein the apparatus further comprises:
   means for assuming that clock arrival times are those calculated for the simulated global clock net;
   means for re-simulating at least one of the plurality of local clock nets to generate a load for the at least one local clock net on the global clock net;
   means for re-simulating the global clock net based in part on the simulated or re-simulated load of each of the plurality of local clock nets; and
   means for combining the simulations and re-simulations to form the complete clock net.

27. The apparatus as defined in claim 26, wherein means for re-simulating at least one of the plurality of local clock nets comprises:
   means for re-simulating the at least one local clock net based on the layout, the component values, and the calculated clock arrival times; and
   means for extracting a load of the at least one local clock net on the global clock net.

28. The apparatus as defined in claim 27, further comprising means for re-simulating at least a second of the plurality of local clock nets in parallel with the at least one local clock net.

29. The apparatus as defined in claim 26, wherein means for re-simulating the global clock net comprises:
   means for inserting the simulated or re-simulated loads of the plurality of local clock nets; and
   means for re-simulating the global clock net based on the layout, the component values, and the simulated or re-simulated local clock net loads.

30. The apparatus as defined in claim 26, further comprising means for storing the plurality of simulation and re-simulation results in a Clock Data Model.

31. An apparatus for determining clock insertion delays for a microprocessor design having a grid-based clock distribution net, the apparatus comprising:
   a partitioner for horizontally and vertically partitioning the complete grid-based clock distribution net into a global clock net and a plurality of local clock nets;
   at least one local clock net simulator for simulating at least one of the plurality of local clock nets to generate a load for the at least one local clock net on the global clock net, said local net simulator including a clock monitor for measuring clock arrival time and slope at each point where a clock element is connected;
   a global clock net simulator for simulating the global clock net based in part on the simulated load of each of the plurality of local clock nets; and
   a merging unit for combining the plurality of simulations to form a complete clock net simulation.

32. The apparatus as defined in claim 31, wherein the partitioner comprises a cutter for breaking the complete clock net into a plurality of parts approximating rectangular grid coordinates.

33. The apparatus as defined in claim 31, wherein the partitioner vertically sub-partitions at least one of the plurality of local clock nets down into at least one sub-local clock net.

34. The apparatus as defined in claim 33, wherein the at least one local clock net simulator simulates the at least one sub-local clock net prior to simulating the corresponding local clock net.

35. The apparatus as defined in claim 31, further comprising at least a second local clock net simulator wherein at least a second of the plurality of local clock nets is simulated in parallel with the at least one local clock net.

36. The apparatus as defined in claim 31, wherein the at least one local clock net simulator comprises:
 a layout extractor for extracting a layout of the local clock net and the conductors routed above and through the local clock net from a microprocessor network database;
 a component value extractor for extracting component values of the elements of the local clock net from the microprocessor network database;
 a local clock net simulator for simulating the local clock net based on the layout and the component values; and
 a load extractor for extracting a load of the local clock net on the global clock net.

37. The apparatus as defined in claim 36, wherein the local clock net simulator assumes for the simulation that the clock arrival times from the global clock net will be simultaneous at all points where the local clock net is connected to the global clock net.

38. The apparatus as defined in claim 31, wherein the global clock net simulator comprises:
 a layout extractor for extracting the layout of the global clock net from a microprocessor network database;
 a component extractor for extracting component values of the elements of the global clock net from the microprocessor network database;
 a load insertion unit for inserting the simulated loads of the plurality of local clock nets; and
 a simulator for simulating the global clock net based on the layout, the component values, and the simulated local clock net loads.

39.m The apparatus as defined in claim 31, further comprising a Clock Data Model for storing the plurality of simulation results.

40. The apparatus as defined in claim 31, further comprising a convergence evaluator for evaluating the complete clock net to determine whether the results converge.

41. The apparatus as defined in claim 40, wherein, when the results are found not to converge:
 the apparatus assumes that clock arrival times are those calculated for the simulated global clock net;
 the at least one local clock net simulator re-simulates at least one of the plurality of local clock nets to generate a load for the at least one local clock net on the global clock net;
 the global clock net simulator re-simulates the global clock net based in part on the simulated or re-simulated load of each of the plurality of local clock nets; and
 the merging unit combines the simulations and re-simulations to form the complete clock net.

42. The apparatus as defined in claim 41, further comprising a Clock Data Model for storing the plurality of simulation and re-simulation results.

43. A computer-readable medium having stored thereon computer-executable instructions for performing a method of determining clock insertion delays for a microprocessor design having a grid-based clock distribution net, the method comprising:
 partitioning the complete grid-based clock distribution net into a global clock net and a plurality of local clock nets;
 simulating each of the plurality of local clock nets to generate a load for each of the plurality of local clock nets on the global clock net, said simulating including measuring clock arrival time and slope at each point where a clock element is connected;
 simulating the global clock net based in part on the simulated load of each of the plurality of local clock nets; and
 combining the plurality of simulations to form a complete clock net simulation.

44. The computer-readable medium as defined in claim 43, wherein partitioning comprises breaking the complete clock net into a plurality of parts approximating rectangular grid coordinates.

45. The computer-readable medium as defined in claim 43, wherein the method further comprises breaking at least one of the plurality of local clock nets down into at least one sub-local clock net.

46. The computer-readable medium as defined in claim 45, wherein the method further comprises simulating the at least one sub-local clock net prior to simulating the corresponding local clock net.

47. The computer-readable medium as defined in claim 43, wherein at least two of the plurality of local clock nets are simulated in parallel.

48. The computer-readable medium as defined in claim 43, wherein simulating each of the plurality of local clock nets comprises:
 extracting a layout of the local clock net and the conductors routed above and through the local clock net from a microprocessor network database;
 extracting component values of the elements of the local clock net from the microprocessor network database;
 simulating the local clock net based on the layout and the component values; and
 extracting a load of the local clock net on the global clock net.

49. The computer-readable medium as defined in claim 48, wherein simulating the local clock net comprises assuming that the clock arrival times from the global clock net will be simultaneous at all points where the local clock net is connected to the global clock net.

50. The computer-readable medium as defined in claim 43, wherein simulating the global clock net comprises:
 extracting the layout of the global clock net from a microprocessor network database;
 extracting component values of the elements of the global clock net from the microprocessor network database;
 inserting the simulated loads of the plurality of local clock nets; and
 simulating the global clock net based on the layout, the component values, and the simulated local clock net loads.

51. The computer-readable medium as defined in claim 43, wherein the method further comprises storing the plurality of simulation results in a Clock Data Model.

52. The computer-readable medium as defined in claim 43, wherein the method further comprises evaluating the complete clock net to determine whether the results converge.

53. The computer-readable medium as defined in claim 52, wherein, if the results do not converge, the method further comprises:
assuming that clock arrival times are those calculated for the simulated global clock net;
re-simulating at least one of the plurality of local clock nets to generate a load for the at least one local clock net on the global clock net;
re-simulating the global clock net based in part on the simulated or re-simulated load of each of the plurality of local clock nets; and
combining the simulations and re-simulations to form the complete clock net.

54. The computer-readable medium as defined in claim 53, wherein re-simulating at least one of the plurality of local clock nets comprises:
re-simulating the at least one local clock net based on the layout, the component values, and the calculated clock arrival times; and
extracting a load of the at least one local clock net on the global clock net.

55. The computer-readable medium as defined in claim 54, wherein the method further comprises re-simulating at least a second of the plurality of local clock nets in parallel with the at least one local clock net.

56. The computer-readable medium as defined in claim 53, wherein re-simulating the global clock net comprises:
inserting the simulated or re-simulated loads of the plurality of local clock nets; and
re-simulating the global clock net based on the layout, the component values, and the simulated or re-simulated local clock net loads.

57. The computer-readable medium as defined in claim 53, wherein the method further comprises storing the plurality of simulation and re-simulation results in a Clock Data Model.

58. A method of determining and analyzing clock insertion delays for a microprocessor design having a grid-based clock distribution net, the method comprising:
partitioning the complete grid-based clock distribution net into a global clock net and a plurality of local clock nets;
simulating each of the plurality of local clock nets to generate a load for each of the plurality of local clock nets on the global clock net, said simulating including measuring clock arrival time and slope at each point where a clock element is connected;
simulating the global clock net based in part on the simulated load of each of the plurality of local clock nets;
combining the plurality of simulations to form a complete clock net simulation; and
analyzing the complete clock net to predict the clock skew for a given data transfer path.

59. The method as defined in claim 58, wherein analyzing comprises:
adjusting an insertion delay of the involved elements of the given data transfer path; and
re-simulating at least one local clock net involved in the given data transfer path.

60. The method as defined in claim 59, further comprising, when the at least one re-simulated local clock net is connected to at least one sub-local clock net, evaluating the clock arrival times to determine whether the sub-local clock net should be re-simulated.

61. The method as defined in claim 59, further comprising evaluating the at least one re-simulated local clock net load to determine whether at least one higher clock net connected to the at least one re-simulated local clock net should be re-simulated.

62. The method as defined in claim 59, further comprising storing the plurality of simulation and re-simulation results in a Clock Data Model.

63. An apparatus for determining clock insertion delays for a microprocessor design having a grid-based clock distribution net, the apparatus comprising:
means for partitioning the complete grid-based clock distribution net into a global clock net and a plurality of local clock nets;
means for simulating each of the plurality of local clock nets to generate a load for each of the plurality of local clock nets on the global clock net, said simulating including measuring clock arrival time and slope at each point where a clock element is connected;
means for simulating the global clock net based in part on the simulated load of each of the plurality of local clock nets;
means for combining the plurality of simulations to form a complete clock net simulation; and
means for analyzing the complete clock net to predict the clock skew for a given data transfer path.

64. The apparatus as defined in claim 63, wherein means for analyzing comprises:
means for adjusting an insertion delay of the involved elements of the given data transfer path; and
means for re-simulating at least one local clock net involved in the given data transfer path.

65. The apparatus as defined in claim 64, further comprising, when the at least one re-simulated local clock net is connected to at least one sub-local clock net, means for evaluating the clock arrival times to determine whether the sub-local clock net should be re-simulated.

66. The apparatus as defined in claim 64, further comprising means for evaluating the at least one re-simulated local clock net load to determine whether at least one higher clock net connected to the at least one re-simulated local clock net should be re-simulated.

67. The apparatus as defined in claim 64, further comprising means for storing the plurality of simulation and re-simulation results in a Clock Data Model.

68. An apparatus for determining clock insertion delays for a microprocessor design having a grid-based clock distribution net, the apparatus comprising:
a partitioner for horizontally and vertically partitioning the complete grid-based clock distribution net into a global clock net and a plurality of local clock nets;
at least one local clock net simulator for simulating at least one of the plurality of local clock nets to generate a load for the at least one local clock net on the global clock net, said simulating including measuring clock arrival time and slope at each point where a clock element is connected;
a global clock net simulator for simulating the global clock net based in part on the simulated load of each of the plurality of local clock nets;

a merging unit for combining the plurality of simulations to form a complete clock net simulation; and an analyzer for analyzing the complete clock net to predict the clock skew for a given data transfer path.

69. The apparatus as defined in claim 68, wherein the analyzer comprises a redesign unit for adjusting an insertion delay of the involved elements of the given data transfer path, wherein the at least one local clock net simulator re-simulates at least one local clock net involved in the given data transfer path.

70. The apparatus as defined in claim 69, further comprising, when the at least one re-simulated local clock net is connected to at least one sub-local clock net, a clock arrival time evaluator for evaluating the clock arrival times to determine whether the sub-local clock net should be re-simulated.

71. The apparatus as defined in claim 69, further comprising a load evaluator for evaluating the at least one re-simulated local clock net load to determine whether at least one higher clock net connected to the at least one re-simulated local clock net should be re-simulated.

72. The apparatus as defined in claim 69, further comprising a Clock Data Model for storing the plurality of simulation and re-simulation results.

73. A computer-readable medium having stored thereon computer-executable instructions for performing a method of determining clock insertion delays for a microprocessor design having a grid-based clock distribution net, the method comprising:

partitioning the complete grid-based clock distribution net into a global clock net and a plurality of local clock nets;

simulating each of the plurality of local clock nets to generate a load for each of the plurality of local clock nets on the global clock net, said simulating including measuring clock arrival time and slope at each point where a clock element is connected;

simulating the global clock net based in part on the simulated load of each of the plurality of local clock nets;

combining the plurality of simulations to form a complete clock net simulation; and analyzing the complete clock net to predict the clock skew for a given data transfer path.

74. The computer-readable medium as defined in claim 73, wherein analyzing comprises:

adjusting an insertion delay of the involved elements of the given data transfer path; and re-simulating at least one local clock net involved in the given data transfer path.

75. The computer-readable medium as defined in claim 74, wherein the method further comprises, when the at least one re-simulated local clock net is connected to at least one sub-local clock net, evaluating the clock arrival times to determine whether the sub-local clock net should be re-simulated.

76. The computer-readable medium as defined in claim 74, wherein the method further comprises evaluating the at least one re-simulated local clock net load to determine whether at least one higher clock net connected to the at least one re-simulated local clock net should be re-simulated.

77. The computer-readable medium as defined in claim 74, wherein the method further comprises storing the plurality of simulation and re-simulation results in a Clock Data Model.

* * * * *